United States Patent
Han et al.

(10) Patent No.: US 12,532,404 B2
(45) Date of Patent: Jan. 20, 2026

(54) HEAT DISSIPATION STRUCTURE OF PRINTED CIRCUIT BOARD, MANUFACTURING METHODS THEREOF, AND HEAT DISSIPATION SYSTEM FOR ELECTRONIC DEVICE

(71) Applicants: HL Klemove Corp., Incheon (KR); HL MANDO CORPORATION, Pyeongtaek-si (KR)

(72) Inventors: Jihoon Han, Incheon (KR); Sanghyun Jin, Incheon (KR); Minha Lee, Incheon (KR); Kunju Koh, Incheon (KR); Seungcho Han, Namyangju-si (KR)

(73) Assignees: HL KLEMOVE CORP., Incheon (KR); HL MANDO CORPORATION, Pyeongtaek -si (KR)

( * ) Notice: Subject to any disclaimer, the term of this patent is extended or adjusted under 35 U.S.C. 154(b) by 405 days.

(21) Appl. No.: 18/196,119

(22) Filed: May 11, 2023

(65) Prior Publication Data

US 2023/0371166 A1  Nov. 16, 2023

(30) Foreign Application Priority Data

May 13, 2022 (KR) .................. 10-2022-0058934
Dec. 5, 2022 (KR) .................. 10-2022-0167799

(51) Int. Cl.
*H05K 1/02* (2006.01)
*H05K 3/40* (2006.01)

(52) U.S. Cl.
CPC ......... *H05K 1/0206* (2013.01); *H05K 3/4038* (2013.01); *H05K 2201/066* (2013.01)

(58) Field of Classification Search
CPC ....... H05K 1/0201–0212; H05K 1/021; H05K 7/20; H05K 7/2039; H05K 7/20436;
(Continued)

(56) References Cited

U.S. PATENT DOCUMENTS 5,200,365 A * 4/1993 Culver ................ H01L 23/36
257/E23.101
6,218,730 B1 * 4/2001 Toy .................... H01L 23/42
257/713
(Continued)

FOREIGN PATENT DOCUMENTS

KR  10-2006-0061583 A   6/2006
KR  10-2009-0128250 A  12/2009
(Continued)

OTHER PUBLICATIONS

Korean Office Action issued on Apr. 17, 2025, in connection with the corresponding Korean Patent Application No. 10-2022-0167799, citing the above reference(s), along with an English machine translation. (22 pages).

*Primary Examiner* — Amir A Jalali
(74) *Attorney, Agent, or Firm* — Hauptman Ham, LLP

(57) ABSTRACT

A heat dissipation structure of a printed circuit board in which a heating element is disposed on one surface thereof and a heat sink is disposed on another surface thereof is provided, The heat dissipation structure includes a heat dissipation hole passing through the printed circuit board in a thickness direction of the printed circuit board, a thermal interface material arranged between the other surface of the printed circuit board and one surface of the heat sink, a bead interposed between the other surface of the printed circuit board and the one surface of the heat sink to form a gap between the printed circuit board and the heat sink, and at least one solder dome disposed on the other surface of the printed circuit board so that a minimum gap between the printed circuit board and the heat sink is secured when the bead collapses.

27 Claims, 11 Drawing Sheets

(58) Field of Classification Search
CPC .. H05K 7/205; H05K 7/20854; H05K 3/4038; H01L 23/34; H01L 23/36; H01L 23/3672; H01L 23/3733; H01L 23/3736; H01L 21/50; H01L 24/17; H01L 24/30; H01L 24/33; H01L 25/0657; H01L 2224/16227; H01L 2224/29193; H01L 2924/0105; H01L 2924/014; H01L 2924/18161; H01L 2023/4043; H01L 2023/405; H01L 2023/4056

See application file for complete search history.

(56) References Cited

U.S. PATENT DOCUMENTS

| | | | | |
|---|---|---|---|---|
| 2004/0232562 | A1* | 11/2004 | Hortaleza | H05K 1/111 257/737 |
| 2015/0257249 | A1* | 9/2015 | Kim | H01L 23/367 361/708 |
| 2022/0418086 | A1* | 12/2022 | Gupta | H05K 1/0204 |
| 2023/0371166 | A1* | 11/2023 | Han | H05K 1/0206 |

FOREIGN PATENT DOCUMENTS

| | | |
|---|---|---|
| KR | 10-2011-0110078 A | 10/2011 |
| KR | 10-2011-0123945 A | 11/2011 |
| KR | 10-2100867 B1 | 4/2020 |

* cited by examiner

HEAT DISSIPATION STRUCTURE OF PRINTED CIRCUIT BOARD, MANUFACTURING METHODS THEREOF, AND HEAT DISSIPATION SYSTEM FOR ELECTRONIC DEVICE

CROSS-REFERENCE TO RELATED APPLICATION

This application claims the benefit of priority to Korean Patent Applications No. 10-2022-0058934, filed on May 13, 2022, and No. 10-2022-0167799, filed on Dec. 5, 2022, in the Korean Intellectual Property Office, the disclosure of which is incorporated herein by reference.

BACKGROUND

1. Field

Embodiments of the present disclosure relate to a heat dissipation structure of a printed circuit board, a method of manufacturing the same, and a heat dissipation system for an electronic device, and more specifically, to a heat dissipation structure of a printed circuit board, in which stable heat dissipation can be achieved through a simple structure and process, a method of manufacturing the same, and a heat dissipation system for an electronic device having the same.

2. Description of the Related Art

As today's automobiles are gradually electronically controlled, electronic control elements are provided in various devices such as powertrains like engines and motors that provide driving power, lighting devices, audio systems, and the like of vehicles. In addition, recently, with the development of technology, devices and systems having various functions have been installed in vehicles to increase passenger convenience, and in the corresponding devices and systems, electronic control elements are essentially required for more efficient operation and rapid response.

Such an electronic control element may be composed of a plurality of parts, and for example, the electronic control element may include a printed circuit board.

Typically, a printed circuit board may be disposed in a housing forming an outline of an electronic control device. One or more parts may be disposed on a printed circuit board, and the parts may be soldered, combined, and disposed on the printed circuit board. Further, it is required to disperse and discharge heat generated from elements mounted on the printed circuit board.

SUMMARY

Therefore, it is an aspect of the present disclosure to provide a heat dissipation structure of a printed circuit board that can stably dissipate heat from various parts or elements through a simple structure and process, a method of manufacturing the same, and a heat dissipation system for an electronic device having the same.

It is another aspect of the present disclosure to provide a heat dissipation structure of a printed circuit board that can prevent occurrence of corrosion by preventing contact between the printed circuit board and a metal member even when a bead collapses, a method of manufacturing the same, and a heat dissipation system for an electronic device having the same.

It is still another aspect of the present disclosure to provide a heat dissipation structure of a printed circuit board that can maintain heat dissipation performance by securing a minimum thickness of a thermal interface material, a method of manufacturing the same, and a heat dissipation system for an electronic device having the same.

It is yet another aspect of the present disclosure to provide a heat dissipation structure of a printed circuit board that can improve product performance and reliability by stably preventing electrical short of the printed circuit board, a method of manufacturing the same, and a heat dissipation system for an electronic device having the same.

It is yet another aspect of the present disclosure to provide a heat dissipation structure of a printed circuit board that can improve the degree of freedom of design of the printed circuit board and peripheral parts, a method of manufacturing the same, and a heat dissipation system for an electronic device having the same.

Additional aspects of the disclosure will be set forth in part in the description which follows and, in part, will be obvious from the description, or may be learned by practice of the disclosure.

In accordance with one aspect of the present disclosure, a heat dissipation structure of a printed circuit board in which a heating element is disposed on a first surface thereof and a heat sink is disposed on a second surface thereof is provided. The heat dissipation structure includes a heat dissipation hole passing through the printed circuit board in a thickness direction of the printed circuit board, a thermal interface material arranged between the second surface of the printed circuit board and a first surface of the heat sink, a bead interposed between the second surface of the printed circuit board and the first surface of the heat sink to form a gap between the printed circuit board and the heat sink, and at least one solder dome disposed on the second surface of the printed circuit board so that a minimum gap between the printed circuit board and the heat sink is secured upon the bead collapsing.

A height of the solder dome may be smaller than a height of the bead.

The bead may be provided with a plurality of beads being collected to form one bead group, and the solder dome may be disposed on a periphery of the bead group.

The solder dome may be disposed on each of a periphery of one side of the bead group and a periphery of another side of the bead group.

The solder dome may extend along the periphery of the bead group.

The bead group may be provided with a plurality of bead groups, and the solder dome may be arranged between a pair of adjacent bead groups.

In accordance with another aspect of the present disclosure, a heat dissipation structure of a printed circuit board in which a heating element is disposed on a first surface thereof and a heat sink is disposed on a second surface thereof is provided. The heat dissipation structure includes a heat dissipation hole passing through the printed circuit board in a thickness direction of the printed circuit board, a thermal interface material arranged between the second surface of the printed circuit board and a first surface of the heat sink, a bead interposed between the second surface of the printed circuit board and the first surface of the heat sink to form a gap between the printed circuit board and the heat sink, and at least one solder dome disposed on the second surface of the printed circuit board so that a minimum thickness of the thermal interface material is maintained.

A height of the solder dome may be greater than the minimum thickness of the thermal interface material.

In accordance with still another aspect of the present disclosure, a method of manufacturing a heat dissipation structure of a printed circuit board in which a heating element is disposed on a first surface thereof and a heat sink is disposed on a second surface thereof is provided. The method includes forming a heat dissipation hole to pass through the printed circuit board in a thickness direction of the printed circuit board, providing a bead forming a gap between the printed circuit board and the heat sink on the second surface of the printed circuit board, providing a thermal interface material between the second surface of the printed circuit board and a first surface of the heat sink, and providing at least one solder dome on the second surface of the printed circuit board so that a minimum gap between the printed circuit board and the heat sink is secured upon the bead collapsing.

The providing of the solder dome may include placing a metal mask having a hole on the second surface of the printed circuit board, adjusting a placement position of the metal mask so that a solder pad disposed on the printed circuit board is disposed on an inner side of the hole, and performing soldering on the solder pad in the inner side of the hole.

In the performing of the soldering, the solder dome may have a height smaller than a height of the bead.

In accordance with yet another aspect of the present disclosure, a method of manufacturing a heat dissipation structure of a printed circuit board in which a heating element is disposed on a first surface thereof and a heat sink is disposed on a second surface thereof is provided. The method includes forming a heat dissipation hole to pass through the printed circuit board in a thickness direction of the printed circuit board, providing a bead forming a gap between the printed circuit board and the heat sink on the second surface of the printed circuit board, providing a thermal interface material between the second surface of the printed circuit board and a first surface of the heat sink, and providing at least one solder dome on the second surface of the printed circuit board so that a minimum thickness of the thermal interface material is maintained.

The providing of the solder dome may include placing a metal mask having a hole on the second surface of the printed circuit board, adjusting a placement position of the metal mask so that a solder pad disposed on the printed circuit board is disposed on an inner side of the hole, and performing soldering on the solder pad in the inner side of the hole.

In the performing of the soldering, the solder dome may have a height greater than the minimum thickness of the thermal interface material.

The metal mask may include a plate which is provided in a plate shape and through which the hole passes in a thickness direction thereof, and a tip which protrudes from a circumference of the hole on an upper surface of the plate, facing away from the printed circuit board, such that a thickness of the tip may be greater than a thickness of the plate.

The metal mask may include a plate which is provided in a plate shape and through which the hole passes in a thickness direction thereof, and the providing of the solder dome may include interposing the gap film having a thickness between a lower surface of the plate, facing the printed circuit board, such that the second surface of the printed circuit board to increase the height of the circumference of the hole.

The gap film may include a film hole passing through the gap film in a thickness direction of the gap film and having a size and shape corresponding to a size and shape of the hole, and a thickness of the gap film may be gradually reduced toward an outside from the film hole.

The metal mask may include a plate which is provided in a plate shape and through which the hole passes in a thickness direction thereof, and a leg which protrudes from the circumference of the hole on a lower surface of the plate, and a thickness of the leg may be greater than a thickness of the plate.

The providing of the solder dome may include placing a metal mask having a hole on the second surface of the printed circuit board, adjusting a placement position of the metal mask so that a solder pad disposed on the printed circuit board is disposed on an inner side of the hole, and performing soldering on the inner side of the hole.

The metal mask may include a plate which is provided in a plate shape and through which the hole passes in a thickness direction thereof, and a diameter or width of the hole may be greater than a diameter or width of the solder pad.

The performing of the soldering may include injecting molten metal into the inner side of the hole, and upon cooling the molten metal, reducing a diameter or width of the solder dome because of surface tension to correspond to the diameter or width of the solder pad and increasing a height of the solder dome to be greater than the minimum thickness of the thermal interface material.

In accordance with another aspect of the present disclosure, a heat dissipation system for an electronic device includes a printed circuit board; a heating element disposed on a first surface of the printed circuit board; a heat discharging element disposed on a second surface of the printed circuit board opposing the first surface: a heat dissipation hole passing through the printed circuit board in a thickness direction of the printed circuit board; a thermal interface material arranged between the second surface of the printed circuit board and a first surface of the heat discharging element; a bead interposed between the second surface of the printed circuit board and the first surface of the heat discharging element such that a gap is defined between the printed circuit board and the heat discharging element; and at least one solder dome disposed on the second surface of the printed circuit board so that a minimum gap between the printed circuit board and the heat discharging element is secured or a minimum thickness of the thermal interface material is maintained upon the bead collapsing.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
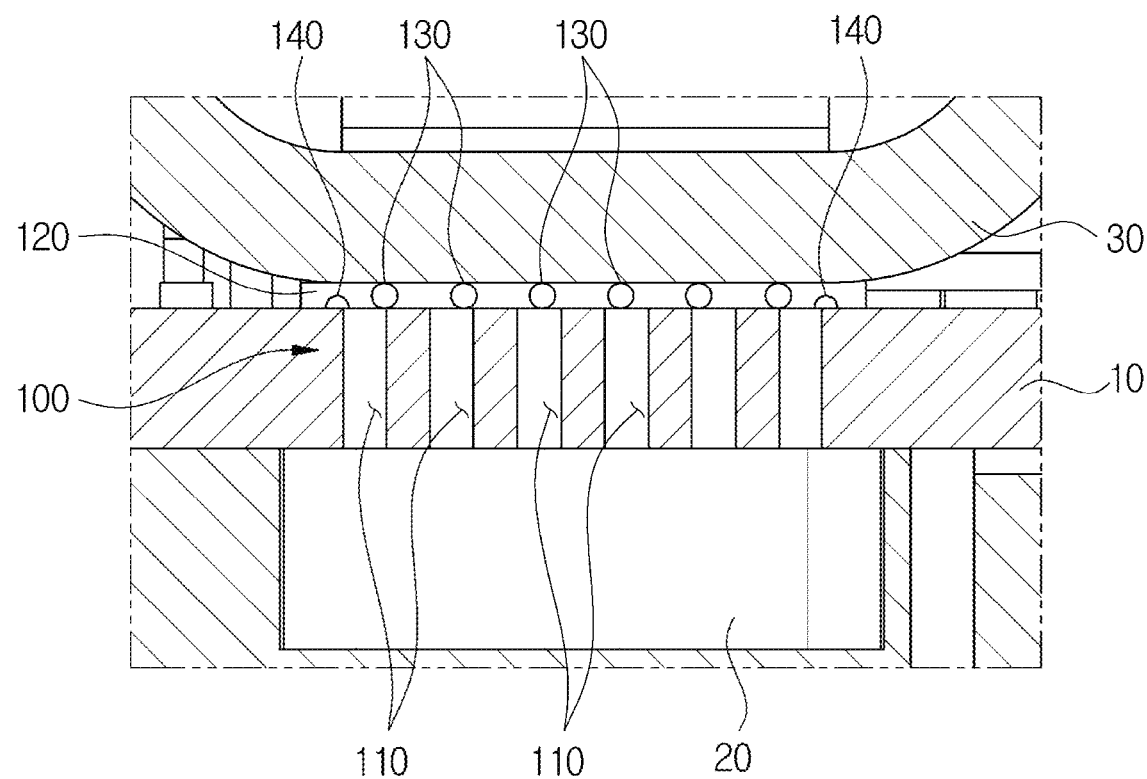
FIG. 1 is a lateral cross-sectional view illustrating a heat dissipation structure of a printed circuit board according to an embodiment.
Figure 2:
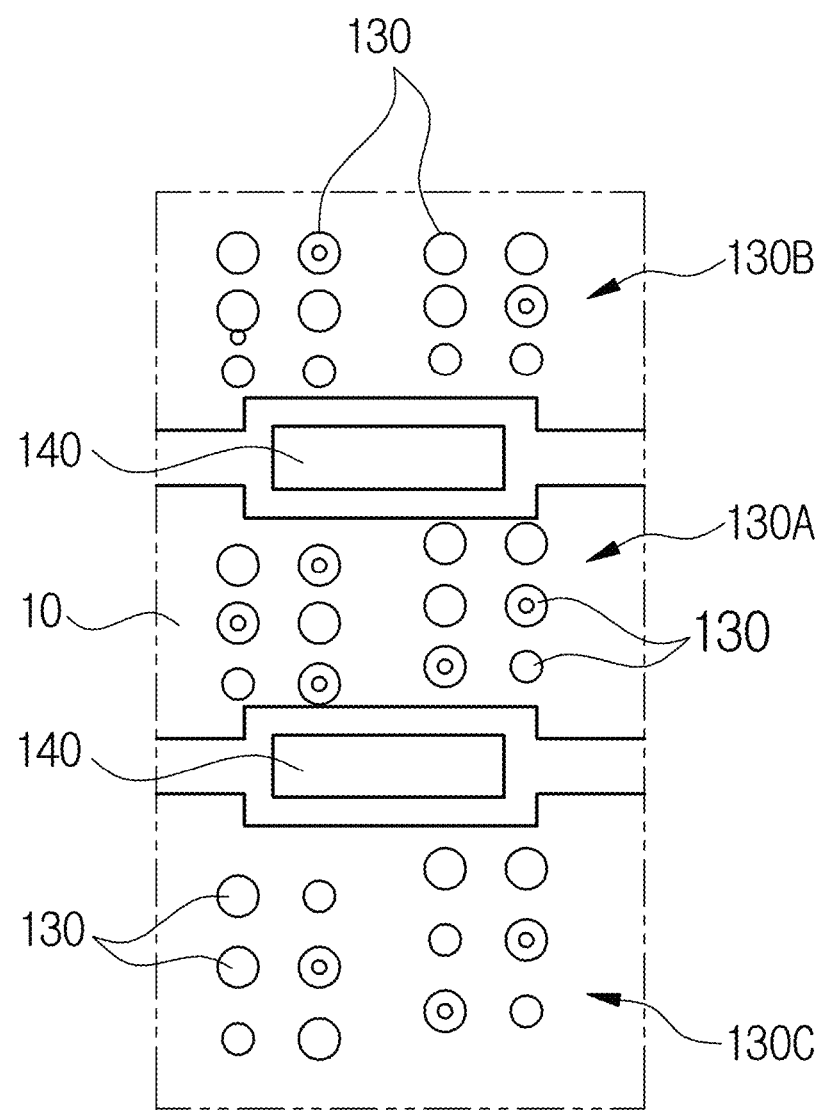
FIG. 2 is a plan view illustrating a state in which solder domes are provided on a printed circuit board according to an embodiment.

FIG. 1 is a lateral cross-sectional view illustrating a heat dissipation structure 100 of a printed circuit board according to an embodiment, and FIG. 2 is a plan view illustrating a state in which solder domes 140 are provided on a printed circuit board 10 according to the embodiment.

Referring to FIGS. 1 and 2, the printed circuit board 10 may be provided in electronic control devices mounted in various types of devices and systems mounted in vehicles. Elements that are control elements may be mounted on the printed circuit board 10 by soldering, heat is generated by operation of the elements, and thus it is necessary to disperse and discharge heat generated from a heating element 20 for stable and continuous operation of an electronic control device.

Accordingly, the heating element 20 may be mounted on a first surface (lower surface in FIG. 1) of the printed circuit board 10, and a heat sink 30 may be provided on a second surface (upper surface in FIG. 1) of the printed circuit board 10. The heat sink 30 may receive the heat generated from the heating element 20 through the heat dissipation structure 100 to be described below, and disperse and discharge the heat to the outside. To this end, the heat sink 30 may be made of a metal material such as metal or the like having high thermal conductivity.

The heat dissipation structure 100 according to the embodiment is provided between the heating element 20 and the heat sink 30 to stably transmit the heat generated from the heating element 20 to the heat sink 30 to perform smooth heat dissipation.

To this end, the heat dissipation structure 100 according to the embodiment may include heat dissipation holes 110 formed to pass through the printed circuit board 10, a thermal interface material 120 provided between the printed circuit board 10 and the heat sink 30, beads 130 for forming a gap between the printed circuit board 10 and the heat sink 30, and solder domes 140 for maintaining a minimum gap between the printed circuit board 10 and the heat sink 30 even when the beads 130 collapse.

The heat dissipation holes 110 may be formed to pass through the printed circuit board 10 in a thickness direction (vertical direction in FIG. 1) of the printed circuit board 10. A plurality of heat dissipation holes 110 may be formed to pass through the printed circuit board 10 according to a size and heat generation amount of the heating element 20, and may allow the heat generated from the heating element 20 disposed on the first surface of the printed circuit board 10 to be transmitted to the second surface of the printed circuit board 10 through the printed circuit board 10.

The thermal interface material 120 may be provided between the second surface of the printed circuit board 10 and a first surface of the heat sink 30. The thermal interface material 120 may be made of one of various materials as long as they can perform thermal coupling between a thermoelectric element and the heat sink 30. For example, the thermal interface material 120 may include at least one of a thermal paste, a thermal adhesive, a thermal gap filler, a thermally conductive pad, a thermal tape, phase-change materials (PCMs), and heat transmitted from the heat dissipation holes 110 may be stably transmitted to the heat sink 30 through the thermal interface material 120.

The beads 130 may be provided between the second surface of the printed circuit board 10 and the first surface of the heat sink 30 to form a gap between the printed circuit board 10 and the heat sink 30. A plurality of beads 130 may be formed on the second surface of the printed circuit board 10 by soldering, the beads 130 form the gap between the printed circuit board 10 and the heat sink 30, and thus a minimum thickness of the thermal interface material 120 provided between the printed circuit board 10 and the heat sink 30 may be maintained at a certain level. The plurality of beads 130 are provided, but as illustrated in FIG. 2, the plurality of beads 130 may be collected to form bead groups 130A, 130B, and 130C. A plurality of bead groups 130A, 130B, and 130C may be provided, and the solder domes 140 to be described below may be disposed between adjacent bead groups 130A, 130B, and 130C.

Meanwhile, the minimum thickness of the thermal interface material 120 described in the embodiment is a thickness at which the thermal interface material 120 can perform thermal coupling between a thermoelectric element and the heat sink 30, that is, a minimum thickness at which the thermal interface material 120 can perform thermal coupling so that the degree of thermal coupling becomes a predesigned level or higher, but the present disclosure is not limited to a specific value.

The solder domes 140 may be provided on the second surface of the printed circuit board 10 to provide and maintain the minimum gap between the printed circuit board 10 and the heat sink 30 when the beads 130 collapse. The solder domes 140 may be mounted on the second surface of the printed circuit board 10 by soldering, and a shape of a cross section of the solder dome 140 may be formed in a dome shape. When the beads 130 collapse, corrosion may occur when the printed circuit board 10 and the heat sink 30 are brought into contact with each other, and furthermore, electrical short of the printed circuit board 10 may occur, resulting in failure or malfunction of the control device. Accordingly, the solder dome 140 is provided on a periphery of the bead 130, and thus the minimum gap between the printed circuit board 10 and the heat sink 30 may be provided when the beads 130 collapse.

The solder dome 140 according to a first embodiment may be provided to have a height smaller than that of the bead 130 for a minimum gap between the second surface of the printed circuit board 10 and the first surface of the heat sink 30. In other words, a height from the second surface of the printed circuit board 10 to an uppermost end (upper end in FIG. 1) of the solder dome 140 is smaller than a height from the second surface of the printed circuit board 10 to an uppermost end (upper end in FIG. 1) of the bead 130, and thus the solder dome 140 may serve as a stopper to limit the narrowing of the gap between the second surface of the printed circuit board 10 and the first surface of the heat sink 30 when the beads 130 collapse.

The solder dome 140 may be provided at the periphery of the bead groups 130A, 130B, and 130C, and may be provided on each of one side and another side of the bead groups 130A, 130B, and 130C so that the second surface of the printed circuit board 10 and the first surface of the heat sink 30 can be stably suppressed from approaching each other when the beads 130 collapse. As described above, the solder dome 140 has a dome shape in cross section and may be formed to extend along the periphery of the bead groups 130A, 130B, and 130C, and in the case in which the plurality of bead groups 130A, 130B, and 130C are provided, the solder domes 140 may be disposed between adjacent bead groups 130A, 130B, and 130C to prevent the second surface of the printed circuit board 10 and a first surface of the heat sink 30 from being brought into contact with each other.

Figure 3:
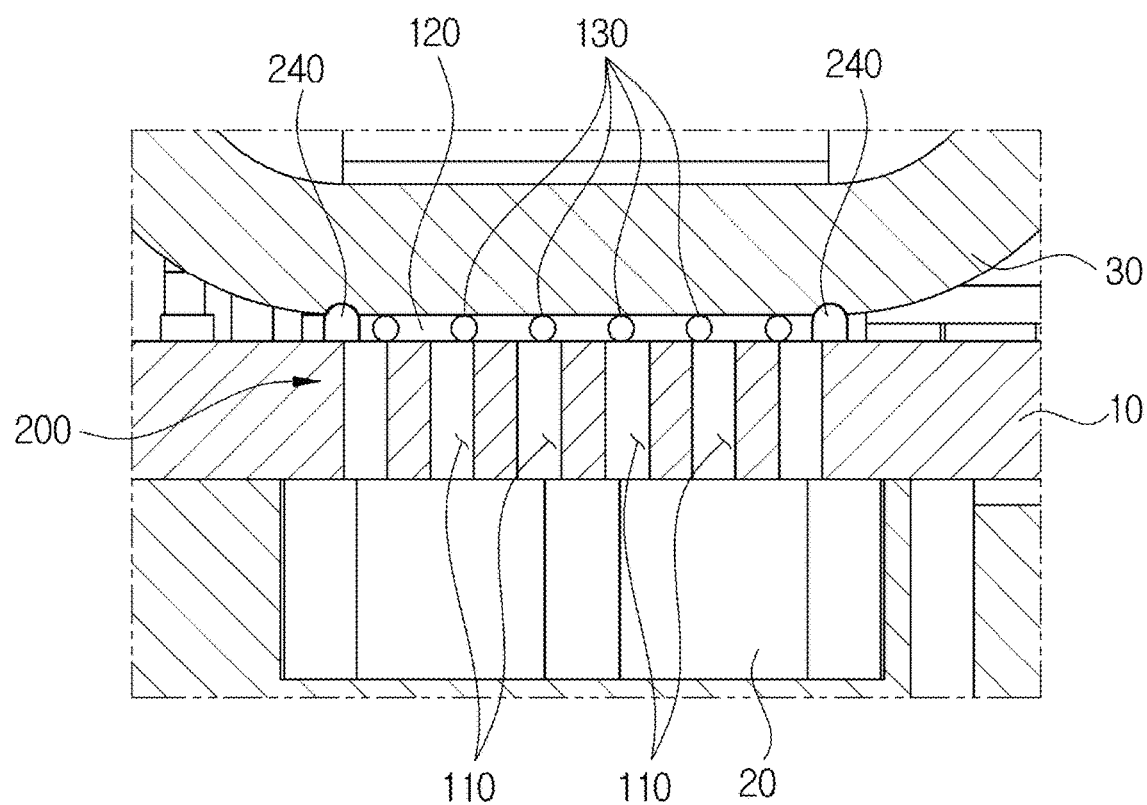
FIG. 3 is a lateral cross-sectional view illustrating a heat dissipation structure of a printed circuit board according to an embodiment.

FIG. 3 is a lateral cross-sectional view illustrating a heat dissipation structure 200 of a printed circuit board according to an embodiment, and referring to FIG. 3, the heat dissipation structure 200 of the printed circuit board according to the embodiment may include a heat dissipation hole 110 formed to pass through a printed circuit board 10, a thermal interface material 120 provided between the printed circuit board 10 and a heat sink 30, beads 130 for forming a gap between the printed circuit board 10 and the heat sink 30, and solder domes 240 for maintaining a minimum gap between the printed circuit board 10 and the heat sink 30 even when the beads 130 collapse.

The solder domes 240 are provided on the second surface of the printed circuit board 10 and are provided to maintain a minimum thickness of the thermal interface material 120 provided between the second surface of the printed circuit board 10 and the first surface of the heat sink 30. When the beads 130 are formed, the case in which an upper end of the bead 130 protrudes upward and is fixed in a horn shape frequently occurs due to the nature of the soldering operation. In this case, a problem may arise in that a difference between a height of the horn-shaped bead 130 and a height of the solder dome 240 increases, and furthermore, when the beads 130 collapse, the thermal interface material 120 is also damaged, and thus heat dissipation may not be smoothly performed. Accordingly, the solder dome 240 according to the embodiment may be mounted on the second surface of the printed circuit board 10 by soldering, and a thickness or height of the solder dome 240 may be greater than a minimum thickness or height of the thermal interface material 120. In other words, a height from the second surface of the printed circuit board 10 to an uppermost end (upper end in FIG. 3) of the solder dome 240 may be greater than a height from the second surface of the printed circuit board 10 to an uppermost end (upper end in FIG. 3) of the thermal interface material 120, and thus it is possible to limit the narrowing of the gap between the second surface of the printed circuit board 10 and the first surface of the heat sink 30 when the beads 130 collapse, and it is possible to prevent damage to the thermal interface material 120 and maintain the thickness even when the beads 130 collapse.

Hereinafter, a method of manufacturing a heat dissipation structure 100 of a printed circuit board according to an embodiment will be described.

Figure 4:
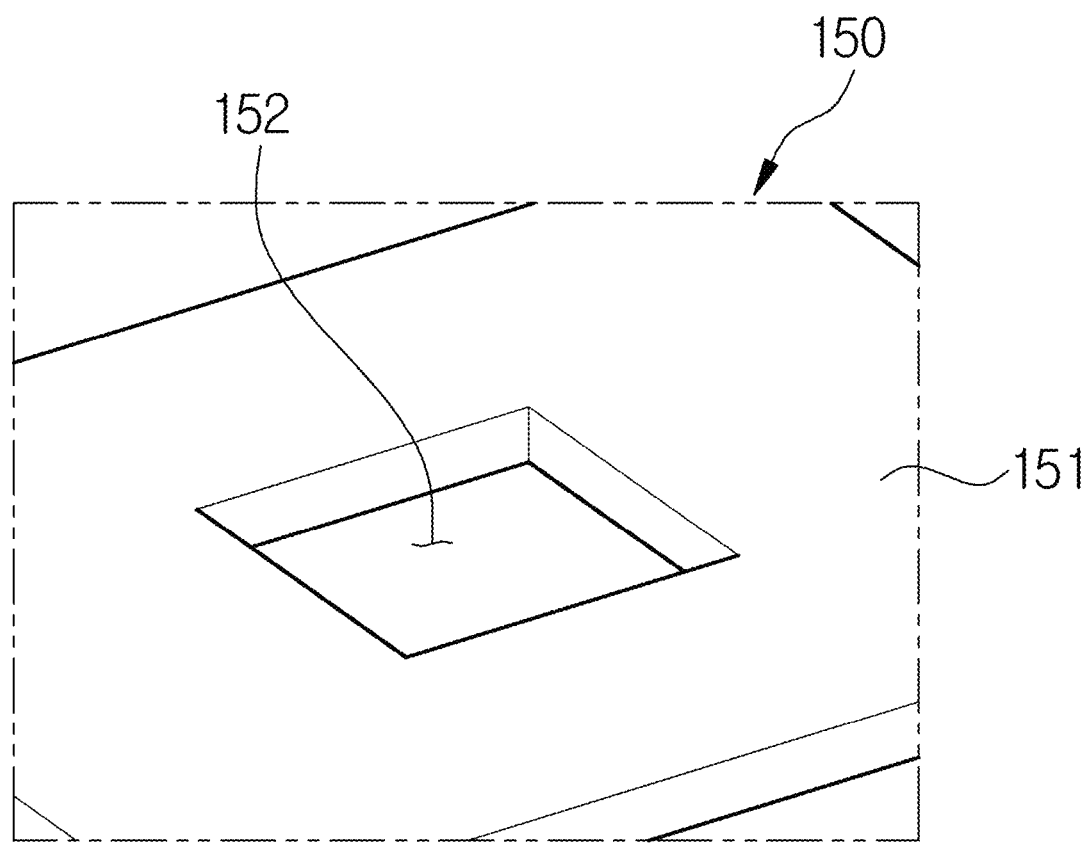
FIG. 4 is a perspective view illustrating a metal mask used in a method of manufacturing a heat dissipation structure of a printed circuit board according to an embodiment.
Figure 5:
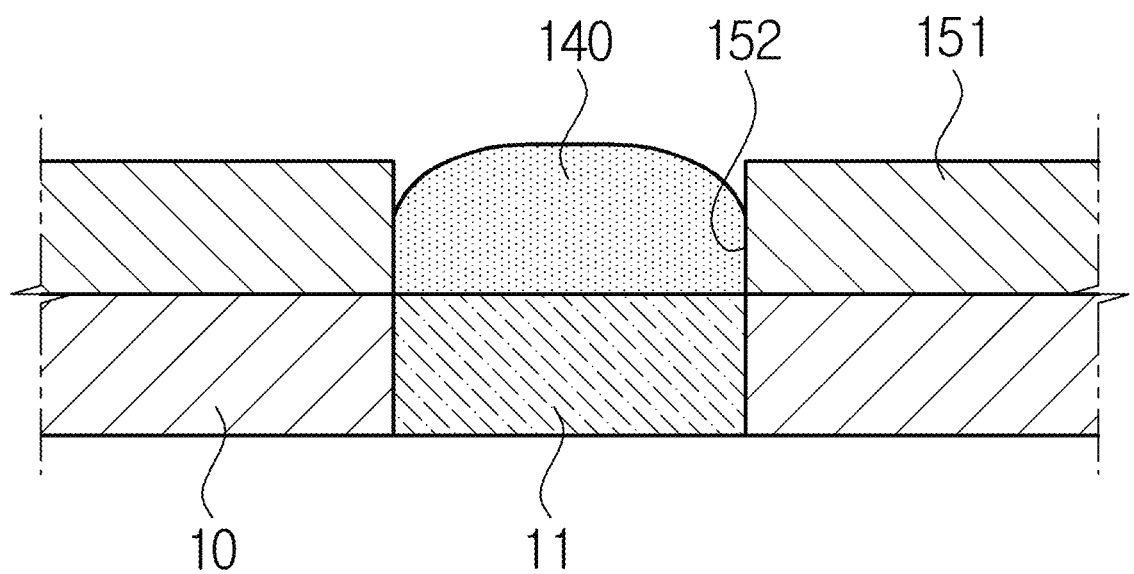
FIG. 5 is a lateral cross-sectional view illustrating a state in which a solder dome is provided by a method of manufacturing a heat dissipation structure of a printed circuit board according to an embodiment.

FIG. 4 is a perspective view illustrating a metal mask 150 used in a method of manufacturing a heat dissipation structure 100 of a printed circuit board according to an embodiment, and FIG. 5 is a lateral cross-sectional view illustrating a state in which a solder dome 140 is provided by the method of manufacturing the heat dissipation structure 100 of the printed circuit board according to the embodiment.

The heat dissipation structure 100 manufactured by the method of manufacturing the heat dissipation structure 100 of the printed circuit board according to the embodiment described below is the same as the heat dissipation structure 100 of the printed circuit board according to the embodiment described above with reference to FIGS. 1 and 2.

Referring to FIGS. 4 and 5, the method of manufacturing the heat dissipation structure 100 of the printed circuit board according to the embodiment includes forming a heat dissipation hole 152 in a printed circuit board 10, forming a bead 130 on the second surface of the printed circuit board 10, providing a thermal interface material 120 between the second surface of the printed circuit board 10 and the first surface of the heat sink 30, and providing a solder dome 140 on the second surface of the printed circuit board 10.

The heat dissipation hole 152 may be formed to pass through the printed circuit board 10 in a thickness direction of the printed circuit board 10, and a plurality of heat dissipation holes 152 may be formed to pass through the printed circuit board 10 according to a size and heat generation amount of the heating element 20. Thereafter, the bead 130 and the thermal interface material 120 may be provided on the second surface of the printed circuit board 10, a gap between the second surface of the printed circuit board 10 and the first surface of the heat sink 30 may be formed due to the bead 130 mounted on the second surface of the printed circuit board 10, and the thermal interface material 120 may be interposed between the second surface of the printed circuit board 10 and the first surface of the heat sink 30.

In this case, at least one solder dome 140 is provided on the second surface of the printed circuit board 10 in order to provide a minimum gap between the printed circuit board 10 and the heat sink 30 even when the bead 130 collapses. The solder dome 140 may be mounted using a metal mask 150. The metal mask 150 may include a plate 151 provided in a plate shape, and a hole 152 which is formed to pass through the plate 151 in a thickness direction (vertical direction in FIG. 5) of the plate 151 and in which the solder dome 140 is mounted.

The providing of the solder dome 140 includes placing the metal mask 150 having the hole 152 on the second surface of the printed circuit board 10 and adjusting a placement position of the metal mask so that a solder pad 11 of the printed circuit board 10 is disposed on an inner side of the hole 152. Thereafter, the solder dome 140 may be provided by performing soldering on a surface (upper surface in FIG. 5) of the solder pad 11 on the inner side of the hole 152.

In this case, the solder dome 140 may be provided to have a height smaller than that of the bead 130 to provide and maintain the minimum gap between the printed circuit board 10 and the heat sink 30 when the bead 130 collapses. In other words, a height from the second surface of the printed circuit board 10 to an uppermost end of the solder dome 140 may be smaller than a height from the second surface of the printed circuit board 10 to an uppermost end of the bead 130. Accordingly, the solder dome 140 may serve as a stopper to limit the narrowing of the gap between the second surface of the printed circuit board 10 and the first surface of the heat sink 30 even when the beads 130 collapse, and accordingly, corrosion of the heat sink 30 and electrical short of the printed circuit board 10 can be prevented.

Figure 6:
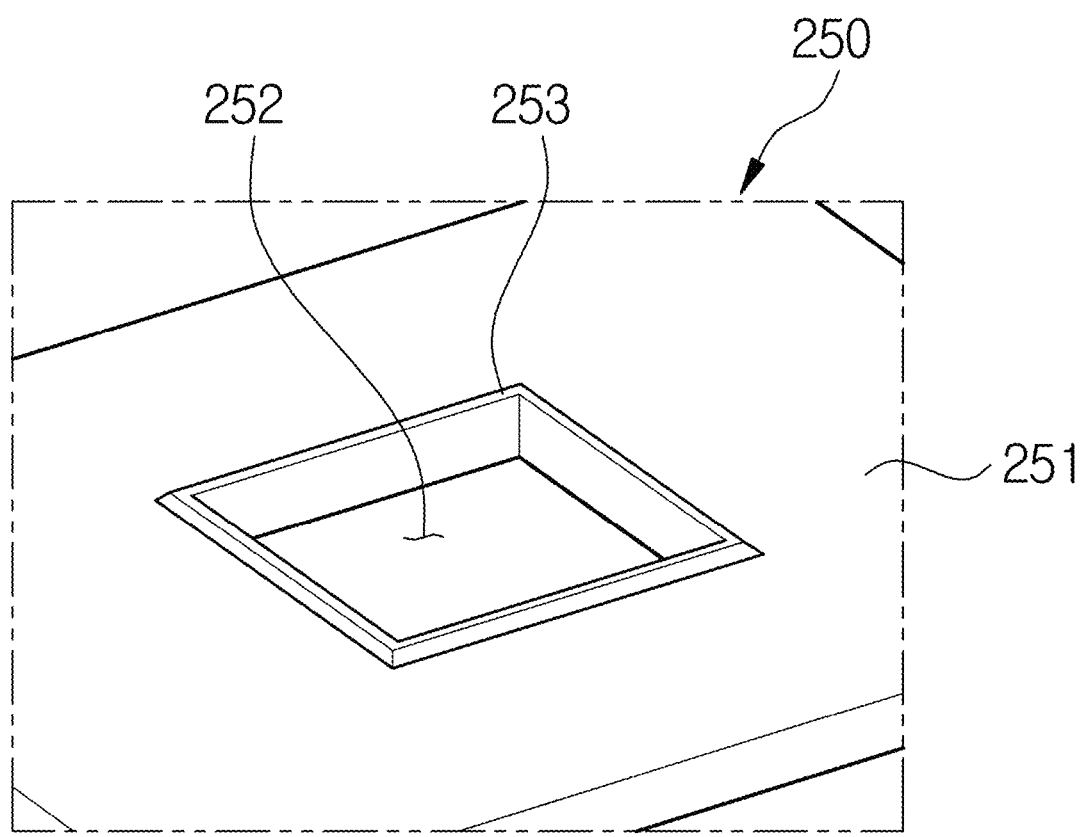
FIG. 6 is a perspective view illustrating a metal mask used in a method of manufacturing a heat dissipation structure of a printed circuit board according to an embodiment.
Figure 7:
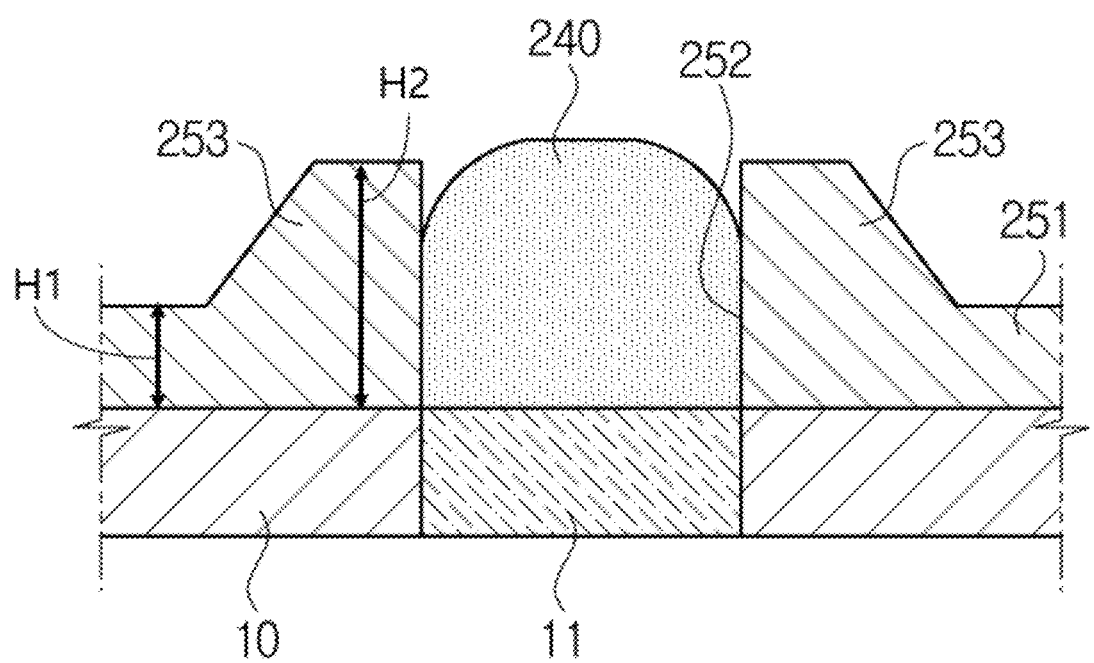
FIG. 7 is a lateral cross-sectional view illustrating a state in which a solder dome is provided by a method of manufacturing a heat dissipation structure of a printed circuit board according to an embodiment.

FIG. 6 is a perspective view illustrating a metal mask 250 used in a method of manufacturing a heat dissipation structure 200 of a printed circuit board according to an embodiment, and FIG. 7 is a lateral cross-sectional view illustrating a state in which a solder dome 240 is provided by the method of manufacturing the heat dissipation structure 200 of the printed circuit board according to the embodiment.

Referring to FIGS. 6 and 7, the method of manufacturing the heat dissipation structure 200 of the printed circuit board according to the embodiment includes forming a heat dissipation hole 252 in a printed circuit board 10, forming a bead 130 on the second surface of the printed circuit board 10, providing a thermal interface material 120 between the second surface of the printed circuit board 10 and the first surface of the heat sink 30, and providing a solder dome 240 on the second surface of the printed circuit board 10.

The heat dissipation hole 252 may be formed to pass through the printed circuit board 10 in a thickness direction of the printed circuit board 10, and a plurality of heat dissipation holes 252 may be formed to pass through the printed circuit board 10 according to a size and heat generation amount of the heating element 20. Thereafter, the bead 130 and the thermal interface material 120 may be provided on the second surface of the printed circuit board 10, a gap between the second surface of the printed circuit board 10 and the first surface of the heat sink 30 may be formed due to the bead 130 mounted on the second surface of the printed circuit board 10, and the thermal interface material 120 may be interposed between the second surface of the printed circuit board 10 and the first surface of the heat sink 30.

In order to smoothly transmit heat transmitted from the heat dissipation hole 252 of the printed circuit board 10 to the heat sink 30, it is required to maintain a thickness of the thermal interface material 120 at a certain level. Therefore, at least one solder dome 240 is provided between the printed circuit board 10 and the heat sink 30 so that a shape and thickness of the thermal interface material 120 can be maintained in their original shape and thickness even when the bead 130 collapses. The solder dome 240 may be mounted using a metal mask 250. The metal mask 250 may include a plate 251 provided in a plate shape, a hole 252 which is formed to pass through the plate 251 in a thickness direction (vertical direction in FIG. 7) of the plate 251 and in which the solder dome 240 is mounted, and a tip 253 which is formed to protrude from a circumference of the hole 252 so that the solder dome 240 is formed to have a height greater than a minimum thickness of the thermal interface material 120 or a height of the bead 130.

The providing of the solder dome 240 includes placing the metal mask 250 having the hole 252 on the second surface of the printed circuit board 10 and adjusting a placement position of the metal mask so that a solder pad 11 of the printed circuit board 10 is disposed on an inner side of the hole 252. Thereafter, the solder dome 240 may be provided by performing soldering on the surface (upper surface in FIG. 7) of the solder pad 11 on the inner side of the hole 252.

The tip 253 of the metal mask 250 may be formed to protrude upward from the circumference of the hole 252 on a surface (upper surface in FIG. 7) of the plate 251. A height H2 of the tip 253, that is, a height from a lower end of the metal mask 250 to an uppermost end of the tip 253 is greater than a height H1 of the plate 251, and thus when the solder dome 240 is formed on the inner side of the hole 252, the height or thickness of the solder dome 240 may be greater than the height or thickness of the bead 130. Accordingly, even when the bead 130 collapses, the minimum thickness of the thermal interface material 120 can be maintained up to a level corresponding to the height of the solder dome 240 or the thickness of the solder dome 240 in a vertical direction (vertical direction in FIG. 7) of the solder dome 240, and thus heat dissipation through the thermal interface material 120 can be maintained smoothly. In addition, after the mounting of the solder dome 240 using the metal mask 250 is completed, the heat sink 30 is provided on the second surface of the printed circuit board 10 so that the solder dome 240 may be brought into contact with the first surface of the heat sink 30, and accordingly, the height of the solder dome 240 may be adjusted or reduced to correspond to the height (or thickness in vertical direction) of the thermal interface material 120 or the height of the bead 130, but even in this case, the height (or thickness in vertical direction) of the thermal interface material 120 can be maintained in the collapse of the bead 130.

Figure 8:
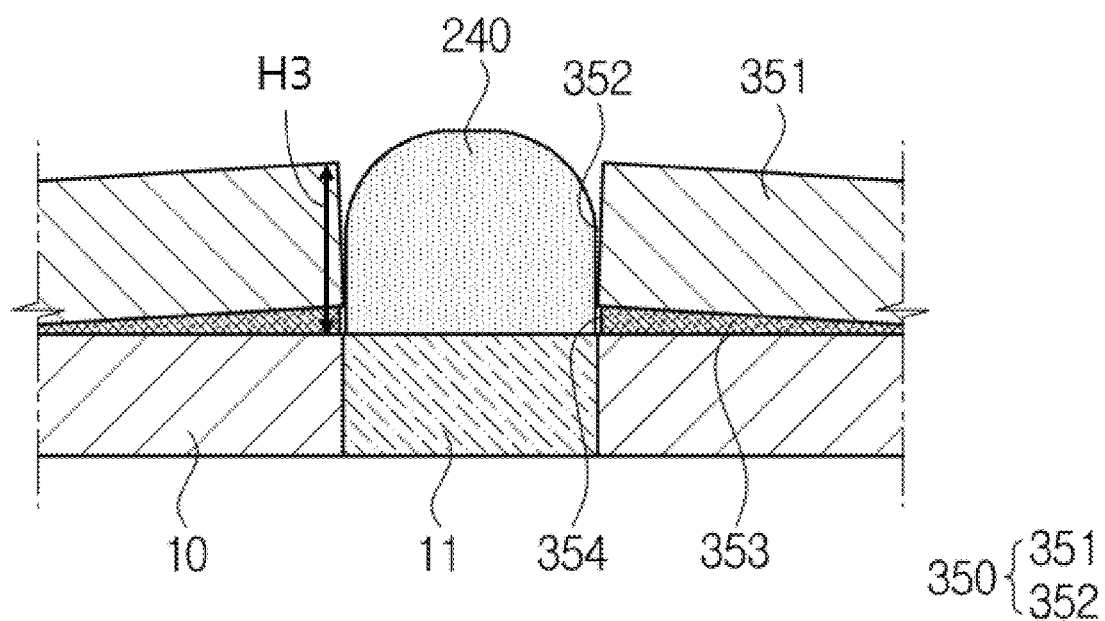
FIG. 8 is a lateral cross-sectional view illustrating a state in which a solder dome is provided by a method of manufacturing a heat dissipation structure of a printed circuit board according to an embodiment.

FIG. 8 is a lateral cross-sectional view illustrating a state in which a solder dome 240 is provided by a method of manufacturing a heat dissipation structure 200 of a printed circuit board according to an embodiment.

Referring to FIG. 8, the method of manufacturing the heat dissipation structure 200 of the printed circuit board according to the embodiment includes forming a heat dissipation hole 352 in a printed circuit board 10, forming a bead 130 on the second surface of the printed circuit board 10, providing a thermal interface material 120 between the second surface of the printed circuit board 10 and the first surface of the heat sink 30, and providing a solder dome 240 on the second surface of the printed circuit board 10.

The heat dissipation hole 352 may be formed to pass through the printed circuit board 10 in a thickness direction of the printed circuit board 10, and a plurality of heat dissipation holes 352 may be formed to pass through the printed circuit board 10 according to a size and heat generation amount of the heating element 20. Thereafter, the bead 130 and the thermal interface material 120 may be provided on the second surface of the printed circuit board 10, a gap between the second surface of the printed circuit board 10 and the first surface of the heat sink 30 may be formed due to the bead 130 mounted on the second surface of the printed circuit board 10, and the thermal interface material 120 may be interposed between the second surface of the printed circuit board 10 and the first surface of the heat sink 30.

In order to smoothly transmit heat transmitted from the heat dissipation hole 352 of the printed circuit board 10 to the heat sink 30, it is required to maintain a thickness of the thermal interface material 120 at a certain level. Therefore, at least one solder dome 240 is provided between the printed circuit board 10 and the heat sink 30 so that a shape and thickness of the thermal interface material 120 can be maintained in their original shape and thickness even when the bead 130 collapses. The solder dome 240 may be mounted using a metal mask 350. The metal mask 350 may include a plate 351 provided in a plate shape and a hole 352 which is formed to pass through the plate 351 in a thickness direction (vertical direction in FIG. 8) of the plate 351 and in which the solder dome 240 is mounted, and a gap film 353 having a predetermined thickness (thickness in vertical direction in FIG. 8) may be interposed between a lower surface of the plate 351 and the second surface of the printed circuit board 10 in order to increase a height of a circumference of the hole 352 so that the solder dome 240 is formed to have a height greater than a minimum thickness of the thermal interface material 120 or a height of the bead 130. The gap film 353 may include a film hole 354 which is formed to pass through the gap film 353 in a thickness direction of the gap film 353 and in which soldering is performed on an inner side thereof together with the hole 352 of the metal mask 350, and the film hole 354 may be formed to correspond to a size and shape of the hole 352 of the metal mask 350.

In the providing of the solder dome 240, the metal mask 350 having the hole 352 is disposed on the second surface of the printed circuit board 10, and the gap film 353 having a thickness may be interposed between a lower surface of the metal mask 350 and the second surface of the printed circuit board 10. The height H3 of the circumference of the hole 352 of the metal mask 350 may be increased due to the gap film 353, and the thickness of the gap film 353 may be gradually reduced toward the outside from the film hole 354. Thereafter, a placement position of the metal mask is adjusted so that the solder pad 11 of the printed circuit board 10 is disposed on an inner side of the hole 352 of the metal mask 350 and an inner side of the film hole 354 of the gap film 353, and then the solder dome 240 may be provided by performing soldering on the surface (upper surface in FIG. 8) of the solder pad 11 on the inner side of the hole 352 of the metal mask 350 and the inner side of the film hole 354.

As the gap film 353 is interposed on the lower surface of the metal mask 350, a height from a lower end of the plate 351 of the metal mask 350 to an uppermost end of the plate 351 of the circumference of the hole 352 is greater than a height of the plate 351, and thus when the solder dome 240 is formed on the inner side of the hole 352 and the film hole 354, a height or thickness of the solder dome 240 may be greater than the height or thickness of the bead 130. Accordingly, even when the bead 130 collapses, the minimum thickness of the thermal interface material 120 can be maintained up to a level corresponding to the height of the solder dome 240 or the thickness of the solder dome 240 in a vertical direction (vertical direction in FIG. 8) of the solder dome 240, and thus heat dissipation through the thermal interface material 120 can be maintained smoothly. In addition, after the mounting of the solder dome 240 using the metal mask 350 is completed, the heat sink 30 is provided on the second surface of the printed circuit board 10 so that the solder dome 240 may be brought into contact with the first surface of the heat sink 30, and accordingly, the height of the solder dome 240 may be adjusted or reduced to correspond to the height (or thickness in vertical direction) of the thermal interface material 120 or the height of the bead 130, but even in this case, the height (or thickness in vertical direction) of the thermal interface material 120 can be also maintained in the collapse of the bead 130.

Figure 9:
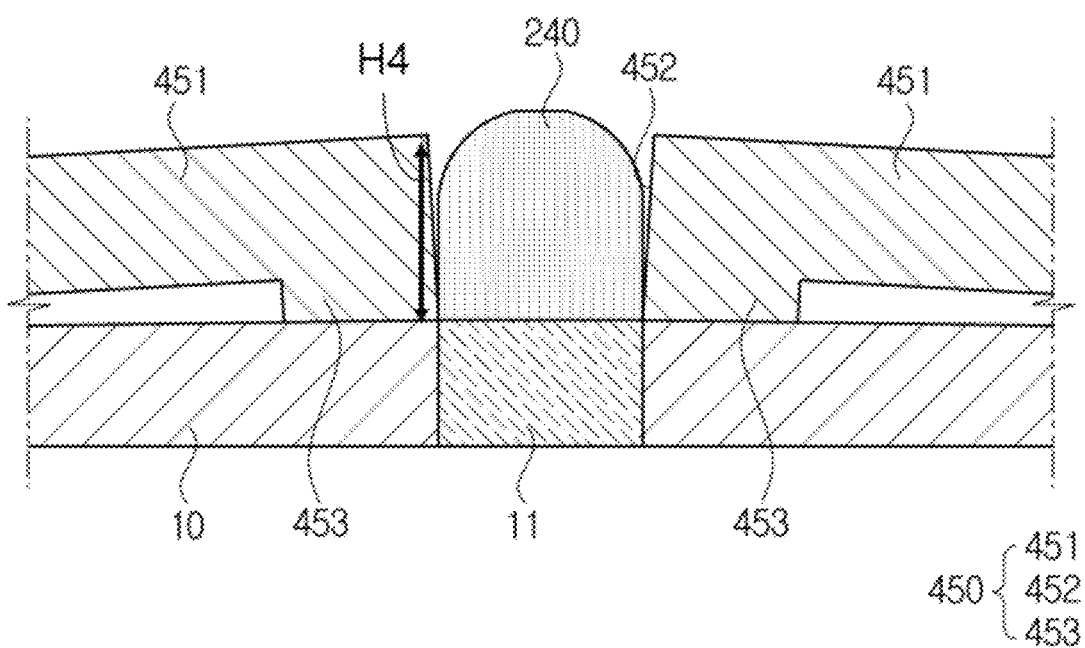
FIG. 9 is a lateral cross-sectional view illustrating a state in which a solder dome is provided by a method of manufacturing a heat dissipation structure of a printed circuit board according to an embodiment.

FIG. 9 is a lateral cross-sectional view illustrating a state in which a solder dome 240 is provided by a method of manufacturing a heat dissipation structure 200 of a printed circuit board according to an embodiment.

Referring to FIG. 9, the method of manufacturing the heat dissipation structure 200 of the printed circuit board according to the embodiment includes forming a heat dissipation hole 452 in a printed circuit board 10, forming a bead 130 on the second surface of the printed circuit board 10, providing a thermal interface material 120 between the second surface of the printed circuit board 10 and the first surface of the heat sink 30, and providing a solder dome 240 on the second surface of the printed circuit board 10.

The heat dissipation hole 452 may be formed to pass through the printed circuit board 10 in a thickness direction of the printed circuit board 10, and a plurality of heat dissipation holes 452 may be formed to pass through the printed circuit board 10 according to a size and heat generation amount of the heating element 20. Thereafter, the bead 130 and the thermal interface material 120 may be provided on the second surface of the printed circuit board 10, a gap between the second surface of the printed circuit board 10 and the first surface of the heat sink 30 may be formed due to the bead 130 mounted on the second surface of the printed circuit board 10, and the thermal interface material 120 may be interposed between the second surface of the printed circuit board 10 and the first surface of the heat sink 30.

In order to smoothly transmit heat transmitted from the heat dissipation hole 452 of the printed circuit board 10 to the heat sink 30, it is required to maintain a thickness of the thermal interface material 120 at a certain level. Therefore, at least one solder dome 240 is provided between the printed circuit board 10 and the heat sink 30 so that a shape and thickness of the thermal interface material 120 can be maintained in their original shape and thickness even when the bead 130 collapses. The solder dome 240 may be mounted using a metal mask 450. The metal mask 450 includes a plate 451 provided in a plate shape, a hole 452 which is formed to pass through the plate 451 in a thickness direction (vertical direction in FIG. 9) of the plate 451 and in which the solder dome 240 is mounted, and a leg 453 which protrudes from a circumference of the hole 452 on a lower surface of the plate 451 to increase a height of the circumference of the hole 452 so that the solder dome 240 is formed to have a height greater than a minimum thickness of the thermal interface material 120 or a height of the bead 130.

The providing of the solder dome 240 includes placing the metal mask 450 having the hole 452 on the second surface of the printed circuit board 10 and adjusting a placement position of the metal mask so that a solder pad 11 of the printed circuit board 10 is disposed on an inner side of the hole 452. Thereafter, the solder dome 240 may be provided by performing soldering on the surface (upper surface in FIG. 9) of the solder pad 11 on the inner side of the hole 452.

The leg 453 of the metal mask 450 may be formed to protrude downward from the circumference of the hole 452 on one surface (lower surface in FIG. 9) of the plate 451. A height from a lower end of the metal mask 450 to an uppermost end of the circumference of the hole 452 may be greater than a height H4 of the plate 451 due to the leg 453, and accordingly, when the solder dome 240 is formed on the inner side of the hole 452, a height or thickness of the solder dome 240 may be greater than a height or thickness of the bead 130. Accordingly, even when the bead 130 collapses, the minimum thickness of the thermal interface material 120 can be maintained up to a level corresponding to the height of the solder dome 240 or the thickness of the solder dome 240 in a vertical direction (vertical direction in FIG. 9) of the solder dome 240, and thus heat dissipation through the thermal interface material 120 can be maintained smoothly. In addition, after the mounting of the solder dome 240 using the metal mask 450 is completed, the heat sink 30 is provided on the second surface of the printed circuit board 10 so that the solder dome 240 may be brought into contact with the first surface of the heat sink 30, and accordingly, the height of the solder dome 240 may be adjusted or reduced to correspond to the height (or thickness in vertical direction) of the thermal interface material 120 or the height of the bead 130, but even in this case, the height (or thickness in vertical direction) of the thermal interface material 120 can be also maintained in the collapse of the bead 130.

Hereinafter, a method of manufacturing a heat dissipation structure 200 of a printed circuit board according to an embodiment will be described.

Figure 10:
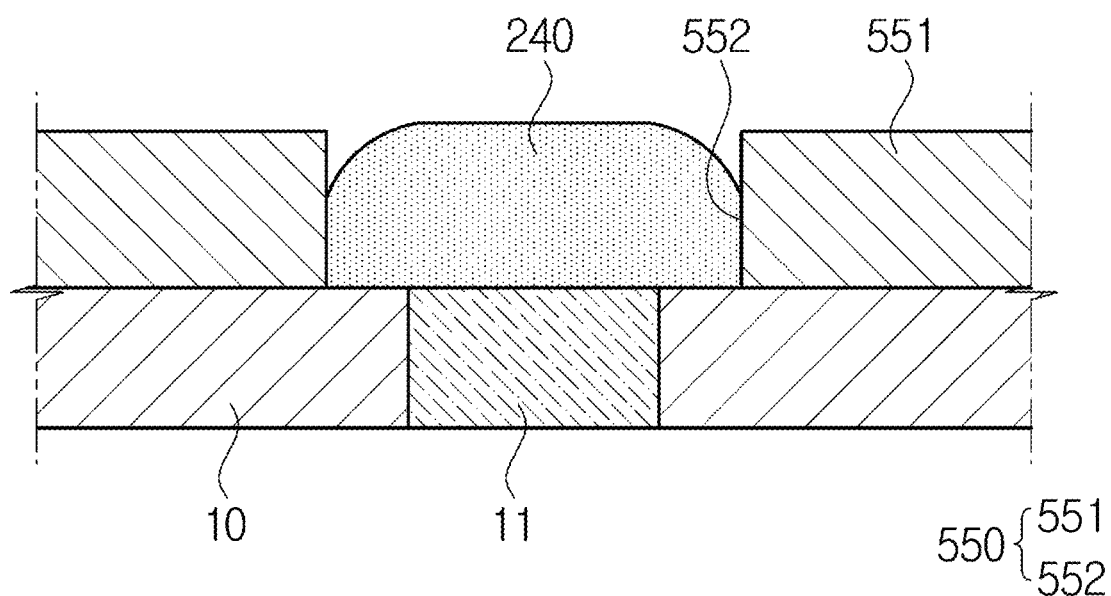
FIG. 10 is a lateral cross-sectional view sequentially illustrating a state in which a solder dome is provided by a method of manufacturing a heat dissipation structure of a printed circuit board according to an embodiment.
Figure 11:
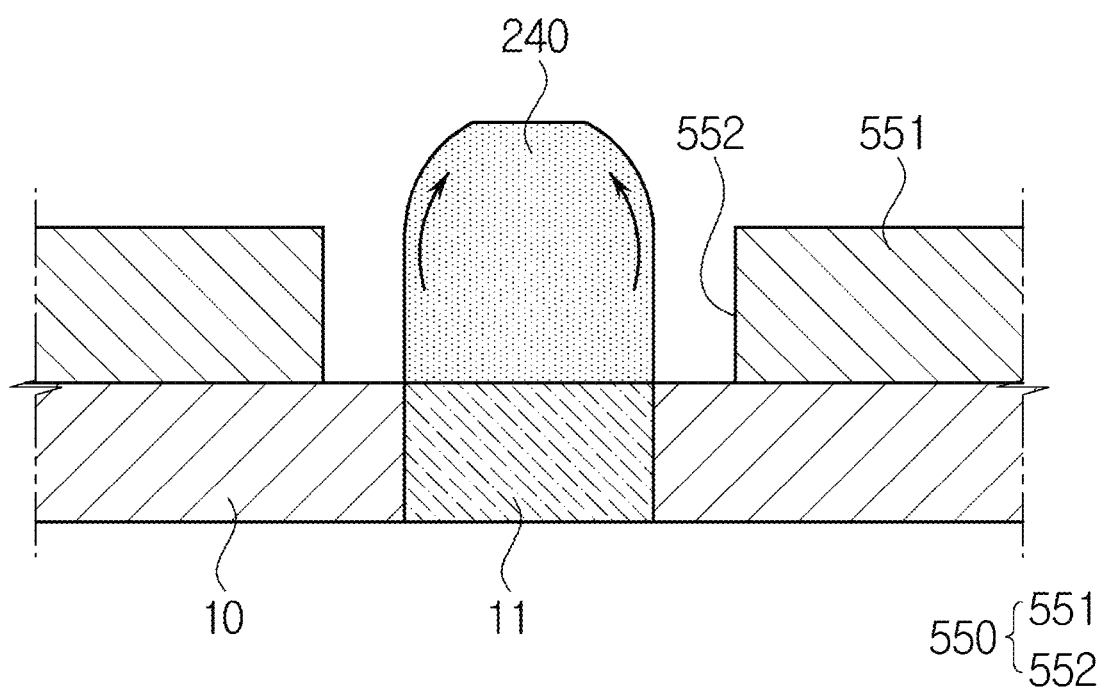
FIG. 11 is a lateral cross-sectional view sequentially illustrating a state in which a solder dome is provided by a method of manufacturing a heat dissipation structure of a printed circuit board according to an embodiment.

FIGS. 10 and 11 are lateral cross-sectional views sequentially illustrating a state in which a solder dome 240 is provided by the method of manufacturing the heat dissipation structure 200 of the printed circuit board according to the embodiment.

The heat dissipation structure 200 manufactured by the method of manufacturing the heat dissipation structure 200 of the printed circuit board according to the embodiment described below is the same as the heat dissipation structure 200 of the printed circuit board according to an embodiment described above with reference to FIG. 3. In addition, in the description of the method of manufacturing the heat dissipation structure 200 of the printed circuit board according to an embodiment described below, since description other than the case of additional description with separate reference numerals is the same as the method of manufacturing the heat dissipation structure 200 of the printed circuit board according to the embodiment described below, a description thereof will be omitted.

Referring to FIGS. 10 and 11, the method of manufacturing the heat dissipation structure 200 of the printed circuit board according to the embodiment includes forming a heat dissipation hole 552 in a printed circuit board 10, forming a bead 130 on the second surface of the printed circuit board 10, providing a thermal interface material 120 between the second surface of the printed circuit board 10 and the first surface of the heat sink 30, and providing a solder dome 240 on the second surface of the printed circuit board 10.

The heat dissipation hole 552 may be formed to pass through the printed circuit board 10 in a thickness direction of the printed circuit board 10, and a plurality of heat dissipation holes 552 may be formed to pass through the printed circuit board 10 according to a size and heat generation amount of the heating element 20. Thereafter, the bead 130 and the thermal interface material 120 may be provided on the second surface of the printed circuit board 10, a gap between the second surface of the printed circuit board 10 and the first surface of the heat sink 30 may be formed due to the bead 130 mounted on the second surface of the printed circuit board 10, and the thermal interface material 120 may be interposed between the second surface of the printed circuit board 10 and the first surface of the heat sink 30.

In order to smoothly transmit heat transmitted from the heat dissipation hole 552 of the printed circuit board 10 to the heat sink 30, it is required to maintain a thickness of the thermal interface material 120 at a certain level. Therefore, at least one solder dome 240 is provided between the printed circuit board 10 and the heat sink 30 so that a shape and thickness of the thermal interface material 120 can be maintained in their original shape and thickness even when the bead 130 collapses. The solder dome 240 may be mounted using a metal mask 550. The metal mask 550 may include a plate 551 provided in a plate shape, and a hole 552 which is formed to pass through the plate 551 in a thickness direction (vertical direction in FIG. 10) of the plate 551 and in which the solder dome 240 is mounted, and a diameter or width of the hole 552 may be greater than a diameter or width of the solder pad 11 on the printed circuit board 10 so that the solder dome 240 is formed to have a height greater than a thickness of the thermal interface material 120 or a height of the bead 130.

The providing of the solder dome 240 includes placing the metal mask 550 having the hole 552 on the second surface of the printed circuit board 10 and adjusting a placement position of the metal mask so that the solder pad 11 of the printed circuit board 10 is disposed on an inner side of the hole 552. Thereafter, the solder dome 240 may be provided by performing soldering on a surface (upper surface in FIGS. 10 and 11) of the solder pad 11 on the inner side of the hole 552.

The performing of the soldering includes injecting molten metal into the inner side of the hole 552 on the solder pad 11 (see FIG. 10), and when the molten metal is cooled, a diameter or width of the solder dome 240 may be reduced because of surface tension to correspond to a diameter or width of the solder pad 11 and a height or thickness (height or thickness in vertical direction in FIG. 11) of the solder dome 240 may be increased to be greater than a thickness of the thermal interface material 120 (see FIG. 11).

When the molten metal is injected into the inner side of the hole 552 on the solder pad 11, in a state in which the metal is molten, an inside of the hole 552 is filled, and the molten metal is brought into contact with a part of the second surface of the printed circuit board 10 as well as a surface (upper surface in FIG. 10) of the solder pad 11 (see FIG. 10). Thereafter, as the molten metal is cooled, the molten metal is changed in a direction of minimizing a surface thereof due to surface tension of the metal, and at the same time, as the molten metal is collected toward the solder pad 11, a diameter or width of the solder dome 240 is reduced to correspond to a diameter or width of the solder pad 11, and a thickness or height of the solder dome 240 is increased to be greater than a minimum thickness of the thermal interface material 120 (see FIG. 11). Accordingly, a height or thickness of the solder dome 240 may be greater than a height or thickness of the bead 130, and even when the bead 130 collapses, the thickness of the thermal interface material 120 can be maintained up to a level corresponding to the height of the solder dome 240 or the thickness of the solder dome 240 in a vertical direction (vertical direction in FIGS. 10 and 11) of the solder dome 240, and thus heat dissipation through the thermal interface material 120 can be maintained smoothly. In addition, after the mounting of the solder dome 240 using the metal mask 550 is completed, the heat sink 30 is provided on the second surface of the printed circuit board 10 so that the solder dome 240 may be brought into contact with the first surface of the heat sink 30, and accordingly, the height of the solder dome 240 may be adjusted or reduced to correspond to the height (or thickness in vertical direction) of the thermal interface material 120 or the height of the bead 130, but even in this case, the height (or thickness in vertical direction) of the thermal interface material 120 can be also maintained in the collapse of the bead 130.

As is apparent from the above description, the heat dissipation structure of the printed circuit board, the method of manufacturing the same, and a heat dissipation system for an electronic device having the same according to the present embodiment can stably dissipate heat from various parts or elements through a simple structure and process.

The heat dissipation structure of the printed circuit board, the method of manufacturing the same, and a heat dissipation system for an electronic device having the same according to the present embodiment can prevent occurrence of corrosion by preventing contact between the printed circuit board and a metal member even when a bead collapses.

The heat dissipation structure of the printed circuit board, the method of manufacturing the same, and a heat dissipation system for an electronic device having the same according to the present embodiment can maintain heat dissipation performance by securing a minimum thickness of a thermal interface material.

The heat dissipation structure of the printed circuit board, the method of manufacturing the same, and a heat dissipation system for an electronic device having the same according to the present embodiment can stably improve product performance and reliability by stably preventing electrical short of the printed circuit board.

The heat dissipation structure of the printed circuit board, the method of manufacturing the same, and a heat dissipation system for an electronic device having the same according to the present embodiment can improve the degree of freedom of design of the printed circuit board and peripheral parts.

What is claimed is:

1. A heat dissipation structure of a printed circuit board in which a heating element is disposed on a first surface thereof and a heat sink is disposed on a second surface thereof, the heat dissipation structure comprising:
    a heat dissipation hole passing through the printed circuit board in a thickness direction of the printed circuit board;
    a thermal interface material arranged between the second surface of the printed circuit board and a first surface of the heat sink;
    a bead interposed between the second surface of the printed circuit board and the first surface of the heat sink such that a gap is defined between the printed circuit board and the heat sink; and
    at least one solder dome disposed on the second surface of the printed circuit board so that a minimum gap between the printed circuit board and the heat sink is secured or a minimum thickness of the thermal interface material is maintained upon the bead collapsing.

2. The heat dissipation structure according to claim 1, wherein a height of the solder dome is smaller than a height of the bead.

3. The heat dissipation structure according to claim 1, wherein the bead is provided with a plurality of beads being collected to form one bead group, and
    the solder dome is disposed on a periphery of the bead group.

4. The heat dissipation structure according to claim 3, wherein the solder dome is disposed on each of a periphery of one side of the bead group and a periphery of another side of the bead group.

5. The heat dissipation structure according to claim 3, wherein the solder dome extends along the periphery of the bead group.

6. The heat dissipation structure according to claim 3, wherein the bead group is provided with a plurality of bead groups, and
    the solder dome is arranged between a pair of adjacent bead groups.

7. The heat dissipation structure according to claim 1, wherein a height of the solder dome is greater than the minimum thickness of the thermal interface material.

8. A method of manufacturing a heat dissipation structure of a printed circuit board in which a heating element is disposed on a first surface thereof and a heat sink is disposed on a second surface thereof, the method comprising:
    forming a heat dissipation hole to pass through the printed circuit board in a thickness direction of the printed circuit board;
    providing a bead such that a gap is defined between the printed circuit board and the heat sink on the second surface of the printed circuit board;
    providing a thermal interface material between the second surface of the printed circuit board and a first surface of the heat sink; and
    providing at least one solder dome on the second surface of the printed circuit board so that a minimum gap between the printed circuit board and the heat sink is secured or a minimum thickness of the thermal interface material is maintained upon the bead collapsing.

9. The method according to claim 8, wherein the providing of the solder dome includes placing a metal mask having a hole on the second surface of the printed circuit board,
    adjusting a placement position of the metal mask so that a solder pad disposed on the printed circuit board is disposed on an inner side of the hole, and
    performing soldering in the inner side of the hole on the solder pad.

10. The method according to claim 9, wherein, in the performing of the soldering, the solder dome has a height smaller than a height of the bead.

11. The method according to claim 9, wherein, in the performing of the soldering, the solder dome has a height greater than the minimum thickness of the thermal interface material.

12. The method according to claim 11, wherein the metal mask includes a plate which is provided in a plate shape and through which the hole passes in a thickness direction thereof, and a tip which protrudes from a circumference of the hole on an upper surface of the plate, facing away from the printed circuit board, such that
    a thickness of the tip, measured from a lower surface of the plate to an upper surface of the tip, is greater than a thickness of the plate.

13. The method according to claim 11, wherein the metal mask includes a plate which is provided in a plate shape and through which the hole passes in a thickness direction thereof, and
    the providing of the solder dome includes providing an expansion member having a thickness to increase a height of the circumference of the hole.

14. The method according to claim 13, wherein the expansion member includes a gap film, and
    the gap film is interposed between a lower surface of the plate, facing the printed circuit board, and the second surface of the printed circuit board to increase the height of the circumference of the hole.

15. The method according to claim 14, wherein the gap film includes a film hole passing through the gap film in a thickness direction of the gap film and having a size and shape corresponding to a size and shape of the hole, and
    a thickness of the gap film is gradually reduced toward an outside from the film hole.

16. The method according to claim 11, wherein the metal mask includes a plate which is provided in a plate shape and through which the hole passes in a thickness direction thereof, and a leg which protrudes from the circumference of the hole on a lower surface of the plate, facing the printed circuit board, such that
    a thickness of the leg, measured from an upper surface of the plate to a lower surface of the leg, is greater than a thickness of the plate.

17. The method according to claim 8, wherein the providing of the solder dome includes placing a metal mask having a hole on the second surface of the printed circuit board,
adjusting a placement position of the metal mask so that a solder pad disposed on the printed circuit board is disposed in an inner side of the hole, and
performing soldering in the inner side of the hole.

18. The method according to claim 17, wherein the metal mask includes a plate which is provided in a plate shape and through which the hole passes in a thickness direction thereof, and
a diameter or width of the hole is greater than a diameter or width of the solder pad.

19. The method according to claim 18, wherein the performing of the soldering includes injecting molten metal into the inner side of the hole, and
upon cooling the molten metal, forming the solder dome.

20. The method according to claim 19, wherein in the forming of the solder dome, upon cooling the molten metal, a diameter or width of the solder dome is reduced because of surface tension to correspond to the diameter or width of the solder pad and a height of the solder dome is increased to be greater than the minimum thickness of the thermal interface material.

21. A heat dissipation system for an electronic device, comprising:
a printed circuit board;
a heating element disposed on a first surface of the printed circuit board;
a heat discharging element disposed on a second surface of the printed circuit board opposing the first surface:
a heat dissipation hole passing through the printed circuit board in a thickness direction of the printed circuit board;
a thermal interface material arranged between the second surface of the printed circuit board and a first surface of the heat discharging element;
a bead interposed between the second surface of the printed circuit board and the first surface of the heat discharging element such that a gap is defined between the printed circuit board and the heat discharging element; and
at least one solder dome disposed on the second surface of the printed circuit board so that a minimum gap between the printed circuit board and the heat discharging element is secured or a minimum thickness of the thermal interface material is maintained upon the bead collapsing.

22. The heat dissipation system of claim 21, wherein a height of the solder dome is smaller than a height of the bead.

23. The heat dissipation system of claim 21, wherein the bead is provided with a plurality of beads being collected to form one bead group, and
the solder dome is disposed on a periphery of the bead group.

24. The heat dissipation structure according to claim 23, wherein the solder dome is disposed on each of a periphery of one side of the bead group and a periphery of another side of the bead group.

25. The heat dissipation structure according to claim 23, wherein the solder dome extends along the periphery of the bead group.

26. The heat dissipation structure according to claim 23, wherein the bead group is provided with a plurality of bead groups, and
the solder dome is arranged between a pair of adjacent bead groups.

27. The heat dissipation structure according to claim 21, wherein a height of the solder dome is greater than the minimum thickness of the thermal interface material.

* * * * *